United States Patent [19]
Tsujino et al.

[11] Patent Number: 5,874,772
[45] Date of Patent: *Feb. 23, 1999

[54] SEMICONDUCTOR DEVICE

[75] Inventors: Mitsunori Tsujino; Mikihiro Kimura, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 749,459

[22] Filed: Nov. 15, 1996

[30] Foreign Application Priority Data

May 20, 1996 [JP] Japan ..................................... 8-124560

[51] Int. Cl.$^6$ ..................... H01L 29/167; H01L 29/207; H01L 29/227; H01L 31/0288
[52] U.S. Cl. ......................... 257/607; 257/655; 257/914
[58] Field of Search .................................. 257/325, 607, 257/655, 914

[56] References Cited

U.S. PATENT DOCUMENTS

| | | | |
|---|---|---|---|
| 4,910,156 | 3/1990 | Takasu et al. | 437/17 |
| 4,931,405 | 6/1990 | Kamijo et al. | 437/12 |
| 4,951,104 | 8/1990 | Kato et al. | |
| 5,096,839 | 3/1992 | Amai et al. | 437/10 |
| 5,220,191 | 6/1993 | Matsushita | 257/499 |
| 5,286,994 | 2/1994 | Ozawa et al. | 257/411 |
| 5,331,193 | 7/1994 | Mukogawa | 257/371 |
| 5,506,178 | 4/1996 | Suzuki et al. | 437/239 |
| 5,554,871 | 9/1996 | Yamashita et al. | 257/336 |
| 5,557,129 | 9/1996 | Oda et al. | 257/345 |
| 5,604,364 | 2/1997 | Ohmi et al. | 257/291 |

FOREIGN PATENT DOCUMENTS

| | | |
|---|---|---|
| 63-92030 | 4/1988 | Japan . |
| 63-269561 | 11/1988 | Japan . |
| 4-42894 | 2/1992 | Japan . |
| 4-287374 | 10/1992 | Japan . |
| 6-177121 | 6/1994 | Japan . |

*Primary Examiner*—Ngân V. Ngô
*Attorney, Agent, or Firm*—McDermott, Will & Emery

[57] ABSTRACT

A semiconductor device is obtained in which initial breakdown voltage of an insulating film is improved. On a silicon substrate, an insulating film is provided which is not more than 100 Å in thickness. An electrode is provided on the silicon substrate, with the insulating film positioned therebetween. Oxygen concentration in the substrate is set to be not more than $1 \times 10^{18}$ atoms/cm$^3$ by old ASTM value.

3 Claims, 5 Drawing Sheets

SEMICONDUCTOR DEVICE

BACKGROUND OF THE INVENTION

1. Field of the Invention

The present invention relates generally to a semiconductor device and, more particularly, to a semiconductor device in which initial breakdown voltage deficiency of an insulating film is improved. The present invention also relates to an improved semiconductor device so that the amount of slight leak at a junction can be reduced.

2. Description of the Background Art

A single-crystal silicon substrate pulled up by the Czochralski process (hereinafter "CZ process") has been conventionally used for a MOS structure consisting of an upper electrode, an insulating film, and a semiconductor substrate, for a MOS field effect transistor (hereinafter "MOSFET") with source/drain regions formed at the both ends of the MOS structure, and for a semiconductor device or the like having a p-n junction diode. However, a silicon wafer obtained by the CZ process gets mixed, when a crystal is growing, with oxygen mainly from a quartz crucible used as a container which accommodates silicon melt. Therefore, the silicon wafer contains oxygen of not less than $10^{18}$ atoms/cm³ (old ASTM (Old American Society for Testing and Materials) value) and a silicon of higher purity has not been obtained.

Since conventional semiconductor devices are formed on substrates which are formed by the CZ process, the devices have been affected by defects caused by oxygen contained in the silicon substrates. Particularly, this oxygen has been troublesome in reliability as it affects Time Dependent Dielectric Breakdown (TDDB) characteristics of the gate oxide film and hot carrier effects. It is required to use low supply voltage in MOSFETs as they are miniaturized, and therefore, the thickness of gate oxide films has become thinner and thinner. Thus, declined reliability due to oxygen has become an increasingly serious problem.

SUMMARY OF THE INVENTION

Therefore, one object of the present invention is to provide a semiconductor device in which initial breakdown voltage deficiency of an insulating film is reduced.

Another object of the present invention is to provide a semiconductor device in which time dependent dielectric breakdown characteristics of an insulating film are improved.

Still another object of the present invention is to provide a semiconductor device with improved hot carrier life.

A further object is to provide a semiconductor device having a diode in which junction slight leak is suppressed.

A further object is to provide a field effect transistor wherein device reliability is improved.

A semiconductor device in accordance with a first aspect of the present invention includes a silicon substrate. On the silicon substrate, an insulating film which is not more than 100 Å in thickness is provided. An electrode is provided on the silicon substrate, with the insulating film positioned therebetween. Oxygen concentration in the silicon substrate is set to be not more than 1×10¹⁸ atoms/cm³ by old ASTM value.

A semiconductor device in accordance with a second aspect of the present invention includes a silicon substrate. A first impurity layer of a first conductivity type is provided in the silicon substrate and extends inward from the surface of the silicon substrate. A second impurity layer of a second conductivity type is provided in the first impurity layer and extends inward from the surface of the first impurity layer. Oxygen concentration in the silicon substrate is set to be not more than 1×10¹⁸ atoms/cm³ by old ASTM value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with respect to accompanying drawings.

First Embodiment

Figure 1:
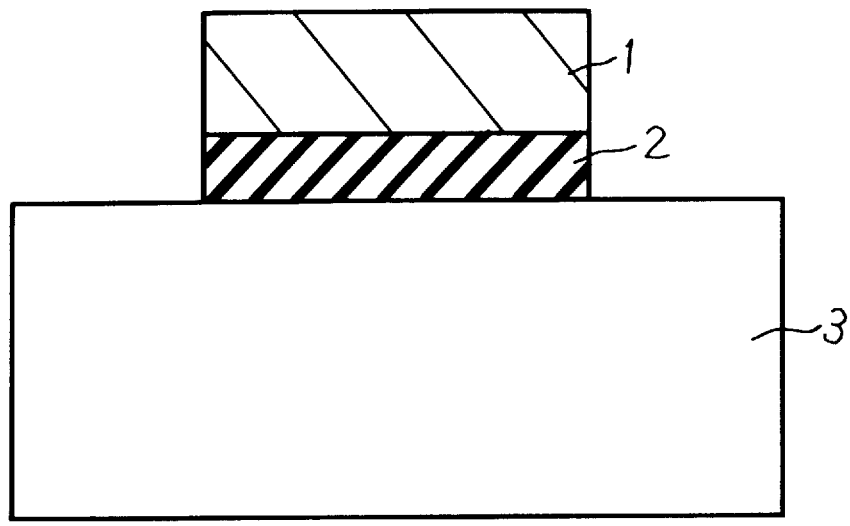
FIG. 1 is a sectional view of a semiconductor device in accordance with a first embodiment of the present invention.

FIG. 1 is a sectional view of a semiconductor device in accordance with the first embodiment of the present invention. An insulating film 2 which is not more than 100 Å in film thickness is provided on a silicon substrate 3. An electrode 1 is provided on silicon substrate 3, with insulating film 2 positioned therebetween. Oxygen concentration in silicon substrate 3 is set to be not more than 1×10¹⁸ atoms/cm³ by old ASTM value. Since insulating film 2 does not exceed 100 Å in film thickness, low supply voltage can be used and operation is speeded up. However, reliability of such a thin insulating film tends to decrease. Therefore, in order to prevent reliability from decreasing, oxygen concentration in the silicon substrate is set not to exceed 1×10¹⁸ atoms/cm³ by old ASTM value. The quality of insulating film 2 is improved by reducing the concentration of oxygen in the substrate. Fabrication of a silicon substrate having such low concentration of oxygen becomes possible by adopting the MCZ process which is an improvement of the CZ process. The MCZ process performs the CZ process while supplying magnetic field.

Figure 2:
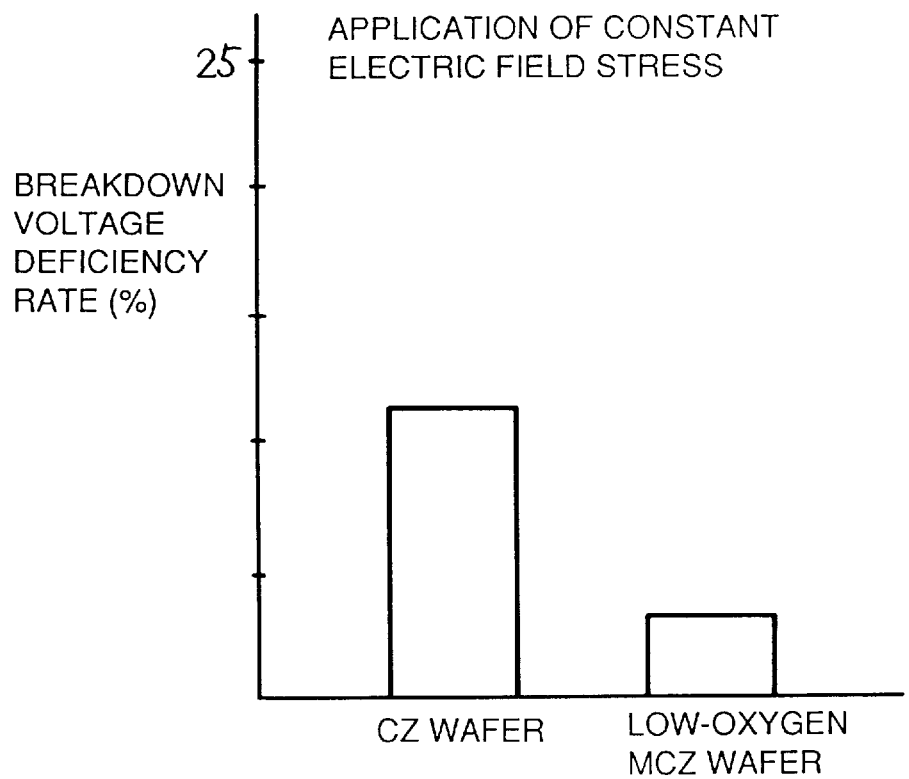
FIG. 2 shows an advantage of the semiconductor of FIG. 1.

In FIG. 2, a semiconductor device formed on a CZ wafer and a semiconductor device formed by using a low-oxygen wafer are compared in terms of initial breakdown voltage yields of each device. FIG. 2 shows breakdown voltage deficiency rates taken immediately after stress is applied, i.e., stress electrically induced by applying an electric field. It can be seen from FIG. 2 that the semiconductor device formed on a silicon wafer by the MCZ process has more reduced initial breakdown voltage deficiency of the insulating film.

Figure 3:
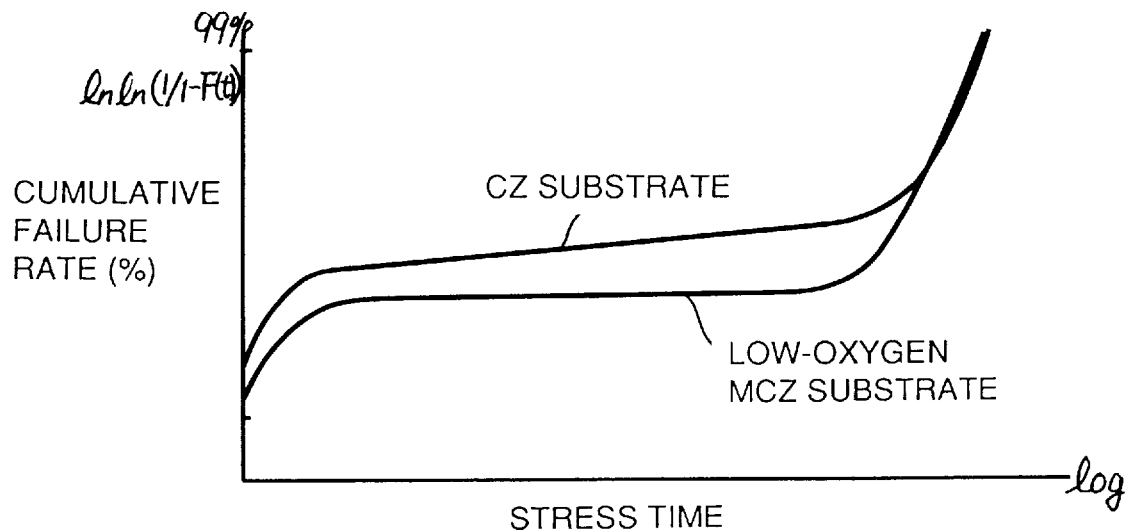
FIG. 3 shows an advantage of the semiconductor device in accordance with the first embodiment of the present invention.

FIG. 3 shows the result of studying TDDB characteristics of a CZ substrate and a low-oxygen MCZ substrate. It is apparent from FIG. 3 that TDDB accidental failures are suppressed to a greater degree by the MCZ substrate than by the CZ substrate.

Figure 4:
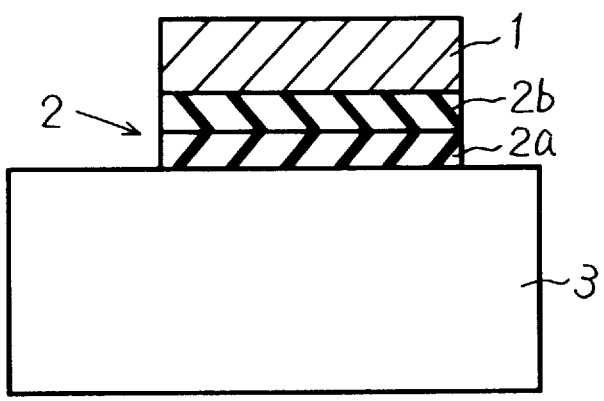
FIG. 4 is a sectional view of another semiconductor device in accordance with the first embodiment of the present invention.

Although the above-described embodiment of the present invention exemplified the case in which insulating film 2 was formed as a single film, the present invention is not limited to this case and it may use an insulating film having a multilayer structure as shown in FIG. 4. In the semiconductor device shown in FIG. 4, an insulating film 2 includes a silicon oxide film 2a and a silicon nitride film 2b which is provided on silicon oxide film 2a. Thus, the quality of an insulating oxide film is improved when it is fabricated as a two-layer structure.

In addition, the quality of an insulating film is improved by forming an insulating film 2 which includes a first silicon oxide film 2a which is formed by the thermal oxidation process and a second silicon oxide film 2b which is formed on first silicon oxide film 2a by the CVD process and is smaller in specific gravity than first silicon oxide film 2a.

In this case also, the whole thickness of insulating film 2 is preferred to be 100 Å or less.

Second Embodiment

Figure 5:
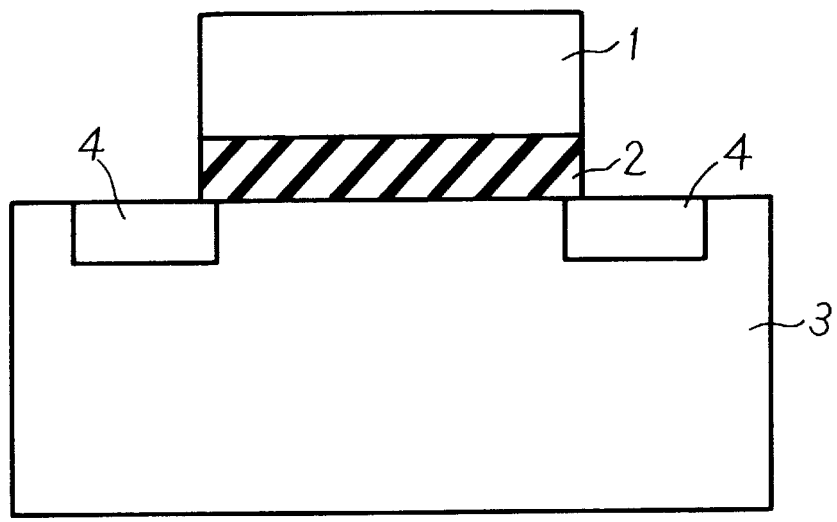
FIG. 5 is a sectional view of a semiconductor device in accordance with a second embodiment of the present invention.

FIG. 5 is a sectional view of a field effect transistor (hereinafter "MOSFET") in accordance with the second embodiment of the present invention. The MOSFET includes a silicon substrate 3. On silicon substrate 3, a gate insulating film 2 which is not more than 100 Å in film thickness is provided. A gate electrode 1 is provided on silicon substrate 3, with above-described gate insulating film 2 positioned therebetween. A pair of source/drain regions 4, 4 is provided at the surface of silicon substrate 3 and on the both sides of gate electrode 1. Oxygen concentration in silicon substrate 3 is set to be not more than $1 \times 10^{18}$ atoms/cm$^3$ by old ASTM value. A substrate having so small an oxygen content is formed by the MCZ process as described above (hereinafter, a substrate formed by this process is referred to as "a low-oxygen MCZ substrate").

Figure 6:
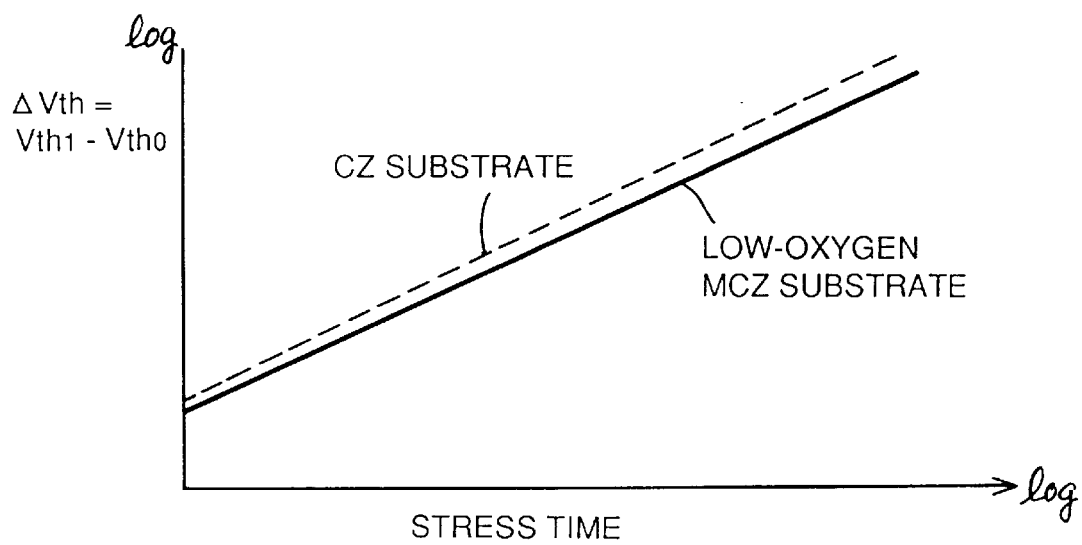
FIG. 6 shows an advantage of the semiconductor device in accordance with the second embodiment of the present invention.

FIG. 6 shows the result of comparing a MOSFET which is manufactured by using a substrate fabricated by the CZ process and a MOSFET which is manufactured by using a low-oxygen MCZ substrate in terms of hot carrier degradation characteristics. In FIG. 6, the ordinate represents variation of threshold voltage ($\Delta V_{th}$), $V_{th1}$ is threshold voltage at each time, and $V_{th0}$ is initial threshold voltage. The abscissa represents the time when stress is applied. As is apparent from FIG. 6, the degree to which hot carrier degradation is suppressed is greater in a MOSFET fabricated by a low-oxygen MCZ substrate than in a MOSFET fabricated by using a CZ substrate.

Figure 7:
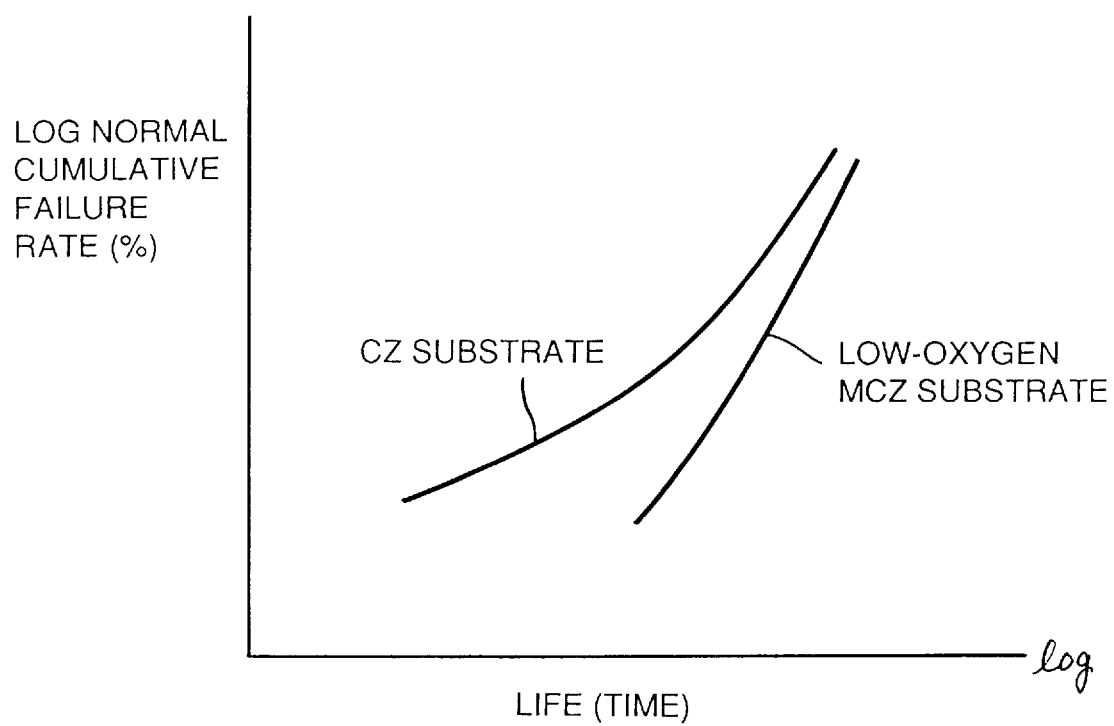
FIG. 7 shows further advantage of the semiconductor device in accordance with the second embodiment of the present invention.

FIG. 7 shows the relationship between hot carrier life and cumulative failure rate which is based on log normal distribution, with respect to a MOSFET fabricated by using a CZ substrate and a MOSFET fabricated by using a low-oxygen MCZ substrate. As is apparent from FIG. 7, a MOSFET fabricated by using a low-oxygen MCZ substrate has improved hot carrier life and can suppress variation of the life to a greater degree when compared to a MOSFET fabricated by using a CZ substrate.

Gate insulating film 3 having a multilayer structure as described in the first embodiment has the same effect.

Third Embodiment

Figure 8:
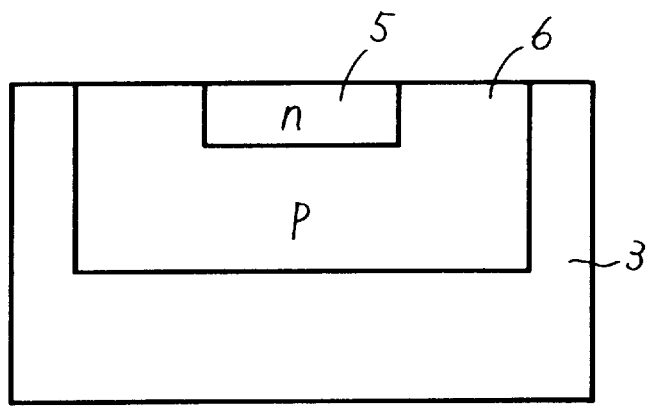
FIG. 8 is a sectional view of a semiconductor device in accordance with a third embodiment of the present invention.

FIG. 8 is a sectional view of a semiconductor device in accordance with the third embodiment which has a p-n junction region. The semiconductor device includes a silicon substrate 3. A p-type impurity layer 6 is provided in silicon substrate 3 and extends inward from the surface of silicon substrate 3. A n-type impurity layer 5 is provided in p-type impurity layer 6 and extends inward from the surface of p-type impurity layer 6. Oxygen concentration in silicon substrate 3 is set to be not more than $1 \times 10^{18}$ atoms/cm$^3$ by old ASTM value.

Figure 9:
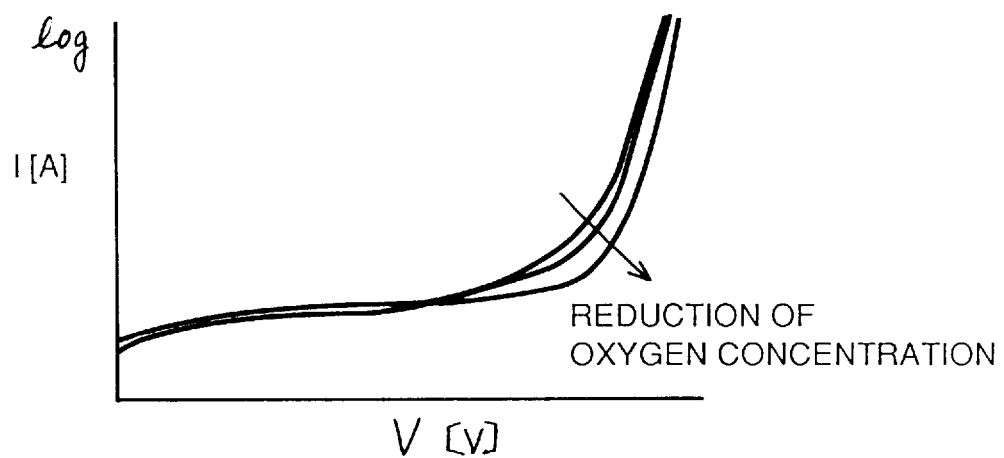
FIG. 9 shows an advantage of the semiconductor device in accordance with the third embodiment of the present invention.

FIG. 9 shows how junction slight leak characteristics depend on oxygen concentration in a substrate. As is apparent from FIG. 9, by reducing oxygen concentration in a substrate, junction breakdown voltage is improved and junction slight leak I [A] immediately before junction breakdown occurs is also reduced. It was also found that the increase of stress inductive "junction slight leak", i.e., an electrically induced stress induces a slight leak current in a junction, was suppressed if oxygen concentration was low in a substrate. Thus, reducing oxygen concentration was found to be effective not only in improving reliability of a gate oxide film but in reducing the amount of slight leak at a junction.

It was also found that a semiconductor device having a shallower junction was obtained both by reducing oxygen concentration in the substrate and by introducing nitrogen ion into n-type impurity layer 5. By forming a shallower junction, the amount of leak at the p-n junction is reduced further.

Although the above-described embodiment exemplified the case in which a n-type impurity layer 5 was formed inside a p-type impurity layer 6, the present invention is not limited to this case and attains the same effect even if a layer 6 is n-type and a layer 5 is p-type.

As described above, according to a semiconductor device in accordance with a first aspect of the present invention, reducing oxygen concentration in a silicon substrate to $1 \times 10^{18}$ atoms/cm$^3$ by old ASTM value or less is effective in reducing initial breakdown voltage deficiency, in mitigating TDDB accidental defects, in lengthening hot carrier life, in suppressing variation of hot carrier life, and in improving reliability of a gate oxide film. Moreover, since the film thickness of an insulating layer does not exceed 100 Å, low supply voltage can be used and operation is speeded up.

In addition, in a semiconductor device having a p-n junction region in accordance with a second aspect of the present invention, junction leak characteristics are suppressed since oxygen concentration in the silicon substrate is set to be not more than $1 \times 10^{18}$ atoms/cm$^3$ by old ASTM value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A p-n junction diode so that the amount of slight leak at a junction can be reduced, comprising:
   a silicon substrate;
   a first impurity layer of a first conductivity type provided in said silicon substrate and extending inward from a surface of the silicon substrate;
   a second impurity layer of a second conductivity type provided in said first impurity layer and extending inward from a surface of said first impurity layer; wherein said first impurity layer is connected to said second impurity layer by a p-n junction, and oxygen concentration in said silicon substrate is set to be at most $1 \times 10^{18}$ atoms/cm$^3$, and said second impurity layer includes nitrogen ions.

2. The p-n junction diode according to claim 1, wherein said first impurity layer is p-conductivity type and said second impurity layer is n-conductivity type.

3. The p-n junction diode according to claim 1, wherein said first impurity layer is n-conductivity type and said second impurity layer is p-conductivity type.

\* \* \* \* \*